United States Patent [19] [11] 4,424,526
Dennard et al. [45] Jan. 3, 1984

[54] STRUCTURE FOR COLLECTION OF IONIZATION-INDUCED EXCESS MINORITY CARRIERS IN A SEMICONDUCTOR SUBSTRATE AND METHOD FOR THE FABRICATION THEREOF

[75] Inventors: Robert H. Dennard, Cortlandt; Matthew R. Wordeman, Mohegan Lake, both of N.Y.

[73] Assignee: International Business Machines Corporation, Armonk, N.Y.

[21] Appl. No.: 268,506

[22] Filed: May 29, 1981

[51] Int. Cl.³ .................... H01L 31/00; H01L 29/92; H01L 29/80; H01L 27/02
[52] U.S. Cl. ..................................... 357/29; 357/14; 357/22; 357/47
[58] Field of Search ................. 357/29, 14, 22 GR, 42, 357/47

[56] References Cited

U.S. PATENT DOCUMENTS 4,176,369 11/1979 Nelson et al. .......................... 357/24
4,247,862 1/1981 Klein et al. ......................... 357/29 X

OTHER PUBLICATIONS

Hsieh et al., "A Field-tunneling Effect on the Collection of Alpha-Particle Generated Carriers in Silicon Devices" *IEEE Electron Dev. Lett.* vol. EDL-2, No. 4, Apr. 1980, pp. 103–105.
Lee, H. S. "High Energy Particle Absorber in Dynamic Memories" *IBM Tech. Disc. Bull.* No. 22, No. 7, pp. 2689–2690, Dec. 1979.
May et al., "Alpha Particle Induced Soft Errors in Dynamic Memories" *IEEE Trans. on Electron Dev.*, vol. ED-26, No. 1, pp. 2–9, Jan. 1979.
McNutt, M. J. "Buried Channel Charge Transfer Device (CTD) Transient Radiation Hardening Using N-P-N Structures", *IEEE Trans. on Nuclear Sci.* vol. NS-27, No. 5, pp. 1338–1342, Oct. 1980.
Sugerman et al., "Semiconductor Device Structure with Low Soft Error Rate", *IBM Tech. Disc. Bull.*, vol. 23, No. 2, pp. 616–617, Jul. 1980.
Yaney et al., "Alpha Particle Tracks in Silicon and their Effect on Dynamic MOS RAM Reliability" *IEEE Trans. on Electron Dev.*, vol. ED-26, No. 1, pp. 10–16, Jan. 1979.

*Primary Examiner*—Martin H. Edlow
*Assistant Examiner*—J. L. Badgett
*Attorney, Agent, or Firm*—Pollock, Vande Sande & Priddy

[57] ABSTRACT

A semiconductor substrate which contains a buried grid-like region of enhanced concentration of an impurity type opposite to that of the semiconductor substrate; and method for the fabrication thereof which includes providing beneath the upper surface of a semiconductor substrate at a first depth a continuous region of a first impurity type which is the same as that of the semiconductor substrate and wherein at preselected isolated discontinuous locations beneath said surface the first impurity type is at a second depth beneath said surface which is greater than said first depth, and then providing beneath said first depth and substantially coincident with said second depth, a second impurity type opposite to that of the first type and at a dosage level lower than the dosage level of the first impurity type so as to provide a grid-like region of enhanced concentration of impurity type opposite to that of the semiconductor substrate for collecting excess minority carriers in the semiconductor substrate.

9 Claims, 10 Drawing Figures

FIG. 1.1
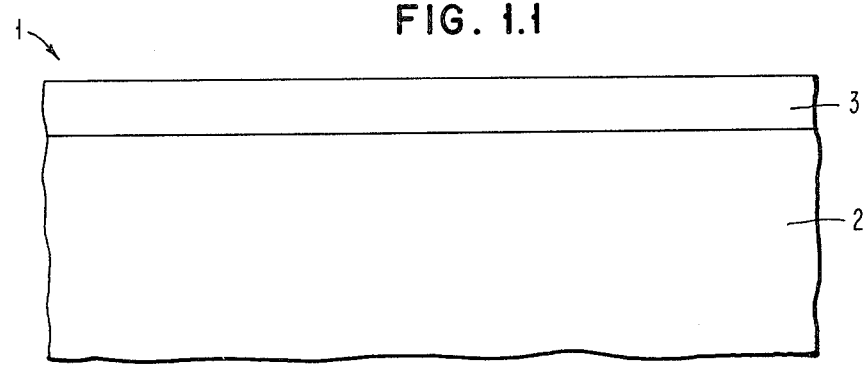
FIG. 1.2
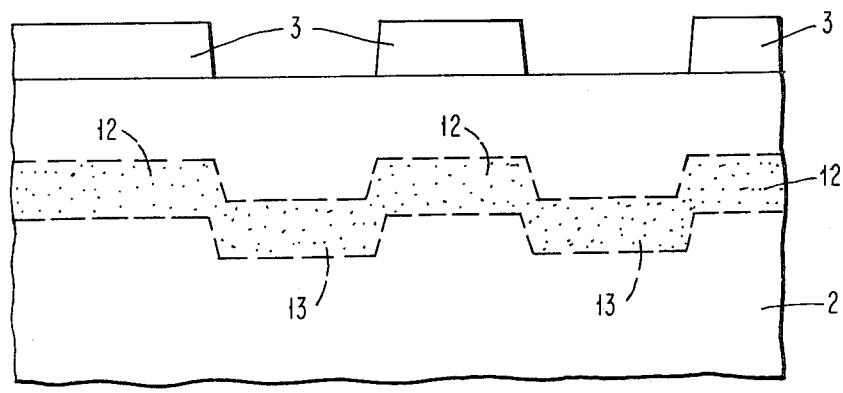
FIG. 1.3
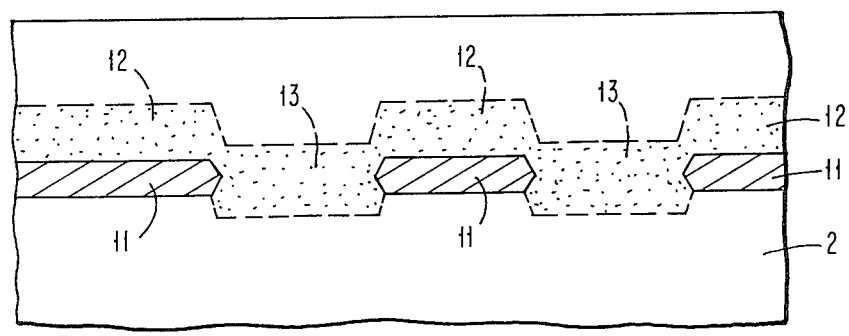

FIG. 1.4
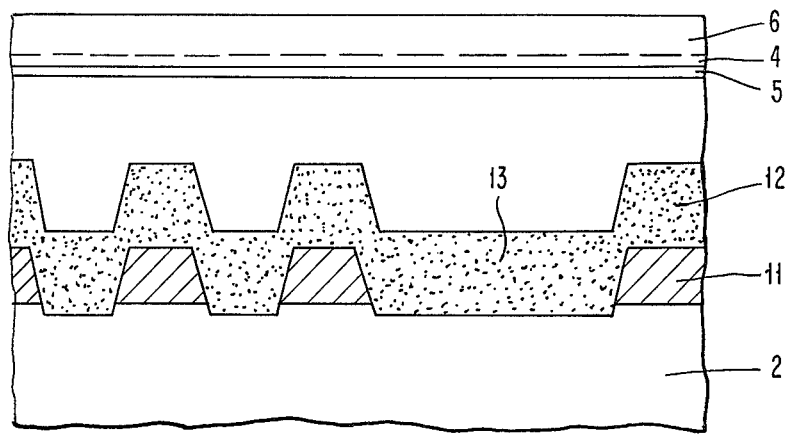
FIG. 1.5
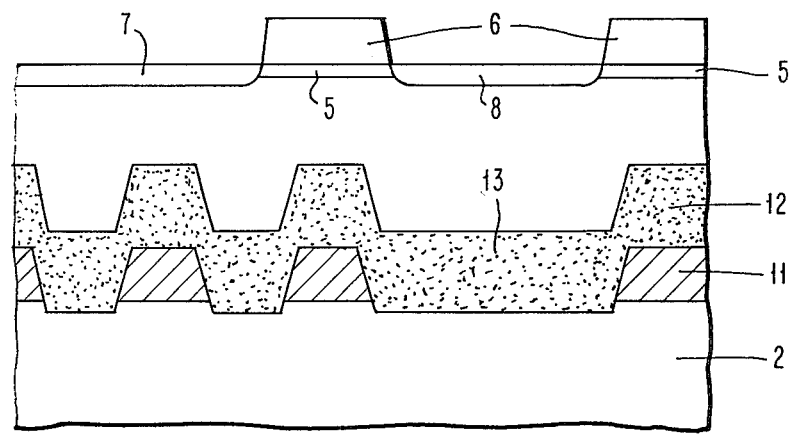

FIG. 1.6
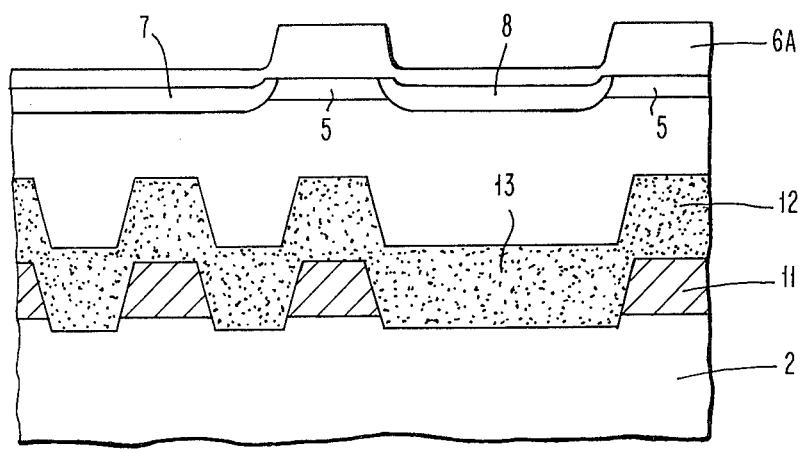
FIG. 1.7
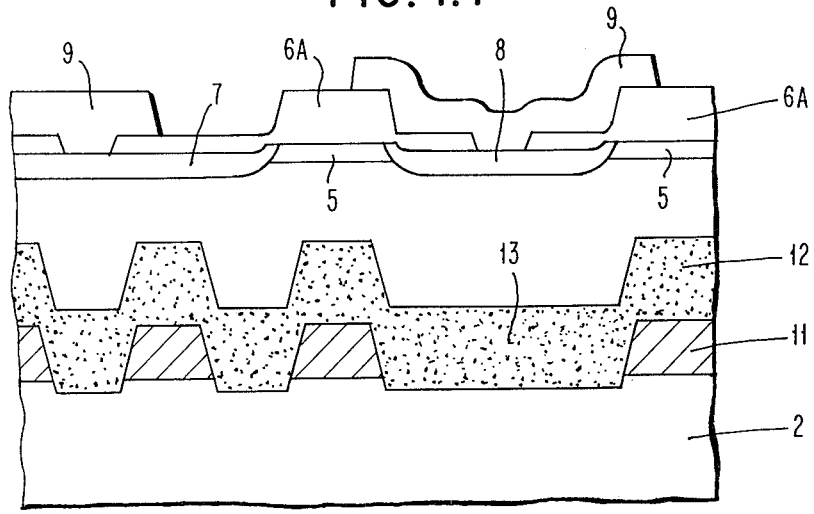

STRUCTURE FOR COLLECTION OF IONIZATION-INDUCED EXCESS MINORITY CARRIERS IN A SEMICONDUCTOR SUBSTRATE AND METHOD FOR THE FABRICATION THEREOF

DESCRIPTION

1. Technical Field

The present invention is concerned with semiconductor substrates and methods for fabrication thereof, which substrates possess protection against ionizing radiation-induced charge within the substrate. The present invention is concerned with eliminating errors in semiconductor circuit operation which occur when circuit nodes collect excess minority carriers which have been generated in the substrate by such means as ionizing radiation.

2. Background Art

In the operation of semiconductor circuits, they are often exposed to low doses of ionizing radiation. It is known that certain forms of ionizing radiation, when incident on a semiconductor circuit, may cause some errors to occur in the circuit. For instance, see T. C. May et al, "Alpha-Particle Induced Soft Errors in Dynamic Memories", IEEE Transactions on Electron Devices, Vol. ED-26, pp. 2–9, January 1979; and D. S. Yaney et al, "Alpha-Particle Tracks In Silicon and Their Effect on Dynamic MOS RAM Reliability," IEEE Transactions on Electron Devices, Vol. ED-26, pp. 10–15, January 1979.

When excess minority carriers are generated by radiation incident on a semiconductor integrated circuit, these charges can diffuse to the surface and be collected in circuit nodes, thereby upsetting the operation of the system and circuit. In addition, it is believed that device errors caused by ionizing radiation will become more prevalent as circuit dimensions and voltages are scaled down. Of particular concern is ionizing radiation due to alpha particles.

The excess minority carriers are often generated and collected at localized sites within the substrate. For instance, minority carriers due to alpha particles are concentrated close to the very thin path created by the penetration of the alpha particles into the semiconductor wafer.

DISCLOSURE OF THE INVENTION

Accordingly, an object of the present invention is to substantially reduce, if not entirely eliminate, errors in semiconductor circuit operation which occurred due to exposure to low doses of ionizing radiation, and especially due to alpha particle radiation. An additional object of the present invention is to at least substantially eliminate errors in the operation of the electronic integrated circuits due to said exposure without a concomitant reduction in the layout density of the circuits on the semiconductor substrate. Another object of the present invention is to provide a fabrication procedure which is relatively simple to carry out. It is another object of the present invention to assure that no single circuit node collects a significant amount of charge which would tend to cause errors in the operation of the device.

The present invention is concerned with a semiconductor substrate which contains a buried, interconnected electrically conductive grid-like (e.g. screen-like) region of enhanced concentration of an impurity type which is opposite to that of the impurity type in the semiconductor substrate forming a p-n junction. The grid-like region attracts excess minority carriers which may be generated in the semiconductor substrate due to the built-in electric field caused by the p-n junction. These excess minority carriers are initially concentrated in a localized area where the ionizing radiation strikes. The excess charge due to the minority carriers are then collected by the grid and will be spread out along the conductive grid and will be reemitted over a large portion of the grid, when the grid is isolated from any power supply and cannot serve as a sink for the minority carriers. When the grid is electrically connected to a power supply, the charge which is collected by the grid is conducted away by the power supply. In either case, no one single circuit node collects a significant amount of charge.

The grid-like region has present an impurity-type which is the same as that of the substrate and which forms vias through the grid. These vias provide conduction paths for displacement current flow into the substrate from circuits above the grid.

The present invention is also concerned with a process for preparing the above-discussed semiconductor device. The process includes providing at a first depth beneath the upper surface of a semiconductor substrate a continuous region of enhanced concentration of a first impurity type which is the same type as the impurity type of the semiconductor substrate. Also, the first impurity type is provided at preselected isolated discontinuous locations beneath said surface at a second depth beneath said surface which is greater than the first depth.

Next, a second impurity type opposite from that of the first type is provided beneath the first depth and substantially coincident with said second depth. The first impurity type is provided at a dosage level which is higher than the dosage level of the second impurity type, in order to render those isolated discontinuous regions with a net impurity concentration of the first type. This provides via connections from the continuous region of impurities of the first type at the top part of the semiconductor substrate to the bottom portion thereof below the aforementioned second depth, and forms a buried interconnected, grid-like region of the second impurity type which is opposite to that of the impurity type of the semiconductive substrate. This grid-like region collects excess minority carriers which are generated in the substrate.

BRIEF DESCRIPTION OF THE DRAWINGS

FIGS. 1.1–1.7 are cross-sectional views of a test structure in various stages of fabrication.

BEST AND VARIOUS MODES FOR CARRYING OUT INVENTION

Figure 2:
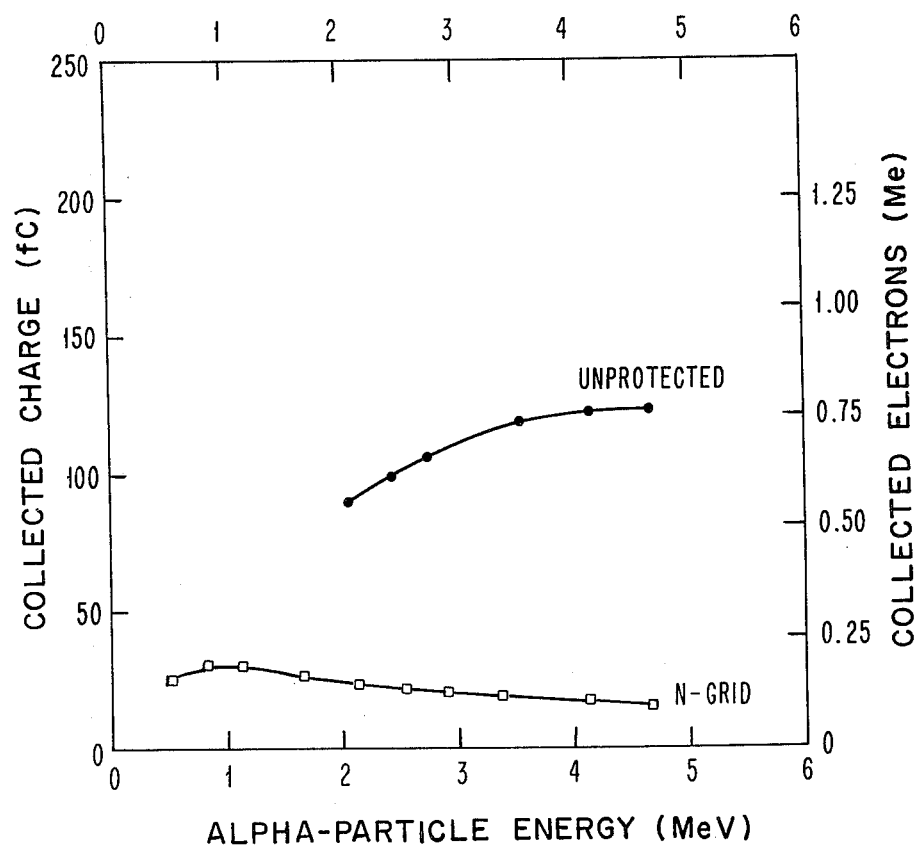
FIG. 2 illustrates measurements of collected charge versus incident alpha-particle energy.

For convenience, the discussion of the device and fabrication steps is directed to the preferred aspects of employing a p-type silicon substrate as the semiconductor substrate and n-type impurities as the diffused or implanted dopant impurities of the second type. This leads to the n-type channel FET technology. Accordingly, it is understood that an n-type substrate and a p-type diffused or implanted dopant impurities of a second type can be employed according to the present invention in the p-type channel FET technology.

It is understood that when the discussion refers to n-type impurities, the process steps are applicable to p-type impurities and vice versa. Also, the present invention is applicable to substrates other than silicon. Also, as used herein, the terms "metallic-type interconnection lines" or "high electrical conductivity interconnection lines" refers to lines or strips of a metal, such as aluminum, as well as nonmetallic materials, such as highly doped polysilicon or intermetallic silicides which, nevertheless, can have electrical conductivities of the magnitude generally possessed by metals.

Also, when reference is made to impurites of a "first type" and to impurities of a "second type", it is understood that the "first type" refers to n- or p-type impurities and the "second type" refers to the opposite conductivity type. That is, if the "first type" is p, then the "second type" is n. If the "first type" is n, then the "second type" is p.

In the discussion reference is made to majority or minority carriers. By "carrier" is signified the free-holes or electrons which are responsible for the passage of current through a semiconductor material. Majority carriers are used in reference to those carriers in the majority in the substrate material under consideration, (i.e. holes in p-type substrate material or electrons in n-type substrate material). By use of the terminology "minority carriers", it is intended to signify those carriers in the minority in the substrate, i.e. holes in n-type substrate material or electrons in p-type substrate material.

Referring to FIG. 1.1, there is shown the initial structure of the invention generally shown as 1. A p-type silicon substrate 2 having any desired crystal orientation (e.g. 100 ) is prepared by slicing and polishing a p-type silicon boule grown in the presence of a p-type dopant, such as boron, following conventional crystal growth techniques. Other p-type dopants for silicon include aluminum, gallium, and indium. One particular p-type substrate is a 5 ohm-centimeter wafer.

Next, the backside of the substrate 2 is implanted with argon for gettering purposes as is well known in the art.

A relatively thick silicon dioxide layer of about one micron is grown on the surface as indicated by 3. This is preferably accomplished by thermal oxidation of the semiconductor substrate. Other methods, such as vacuum or chemical vapor deposition techniques, can be employed if desired. The thermal oxidation is generally carried out at about 1000±° C. in the presence of oxygen. A grid defining layer, such as a layer of resist material (not shown), of the type employed in known lithographic masking and etching techniques is placed over the surface of the oxide layer 3. Any of the well-known photosensitive polymerizable resist materials known in the art may be used. The resist material is applied, such as by spinning on or by spraying. The layer of resist material is dried and then selectively exposed to ultraviolet radiation using a photolithographic mask. The mask is of a transparent material having opaque portions in a predetermined pattern. The masked wafer is subjected to ultraviolet light. If the photoresist material is a positive resist material, the portion of the photoresist underlying the transparent regions of the mask undergoes a reaction which renders it soluble in a liquid in which the unexposed resist is not readily soluble. After removing the mask, the wafer is rinsed in a suitable developing solution which washes away the portions of the resist material which were exposed to ultraviolet light. The portions of the resist material which were under the opaque regions of the mask, and thus not exposed to the ultraviolet light, remain.

Next, the structure is treated to remove the portions of the silicon dioxide 3 not protected by the resist material. The wafer is immersed in a solution of buffered hydrofluoric acid. The etching solution dissolves silicon dioxide but does not attack the resist, or other materials of the assembly. The etched-away portions of the silicon dioxide layer 3 are at preselected, isolated, discontinuous regions where it is desired to provide holes in the grid which serve as vias. A particular pattern employed involves 5 micron by 5 micron grid vias on 10 micron centers. The resist layer can now be completely removed by dissolution in a suitable solvent or can remain now and be subsequently removed.

Next, a p-type dopant, such as boron is implanted. The boron employed is at a dose of about $9.4 \times 10^{12}/cm^2$ and has an energy of about 1.7 MeV. This implant should be aligned 7 degrees from the wafer normal to avoid the effects of implant channelling. In those regions which correspond to where the oxide has been removed, the p-type dopant is implanted further down into the substrate region 13 as shown in FIG. 1.2 as compared to those regions where the oxide layer 3 remains as in 12. The difference in the depth of the implanted p-type dopant in regions 12 and 13 as provided by the patterned oxide layer, 3, must be greater than the thickness of the subsequently implanted n-type doping layer to allow the desired grid to be formed.

Next the remaining oxide and resist are stripped away while only retaining certain features for alignment marks, if desired, for subsequent alignment of future masks. The boron is then spread out into the substrate by heating at about 1000±° C. for 5 minutes in an oxygen atmosphere and then for another 74 minutes in an argon atmosphere causing diffusion. Although it is not entirely necessary to employ this step of spreading p-type impurities at this stage, such is desirable as will be discussed hereinbelow.

The wafers are then implanted with an n-type impurity, such as phosphorus. A typical procedure includes employing a dose of about $2.04 \times 10^{12}/cm^2$ and an energy of about 2.5 MeV. The implant should be aligned 7 degrees from the wafer normal to avoid the effect of channelling. Other n-type dopants for silicon include arsenic and antimony. This produces a layer of n-type dopants of a uniform depth measured from the surface. The energy of the n-type implant must be sufficient that the implanted n-type doping 11 coincides with the depth of the previous p-type implant in region 13 and is deeper than the depth of the p-type implant in region 12 as shown in FIG. 1.3.

The dosage of the n-type dopants must be lower than the dosage of the p-type dopants so that region 13 in FIG. 1.3 results in a net p-type region (i.e. the n-type dopant is totally compensated in this region), whereas region 12, where the p-type dopant is closer to the surface, consists of a layer of enhanced p-type semiconductor above an n-type region thus forming the grid-like structure.

The n-type dopants are typically between about 1 to about 5 microns below the upper surface of the substrate. A preferred embodiment results in a depth of about 2.5 microns, with a thickness of about 0.5 microns.

The amount of n-type dopant is generally sufficient to provide a minimum of about 10 K ohms/square for the resistance of the grid. The resistance of the grid should be as high as possible for easy design, yet should be low enough for providing the ability to dissipate charge. If the doping is too high, then there is a greater need for increased p-type doping which could cause problems in or change the characteristics of the devices on the surface.

The minimum size of the vias 13 employed in the grid is usually that size which is possible by present day photolithographic processes. Typically, the portion of the n-type interconnected impurities of the grid 12 is about 2 to about 3 times the amount of area occupied by the p-type vias 13. The p-type vias should have sufficient area to form a low-resistance conduction path to the top part of the substrate from the bottom portion of the substrate below the grid. The sequence of providing the impurities of the p-type and of the n-type to form a grid-like structure is important for a number of reasons. In particular, such sequence assures that the n-type impurities of the second type are not spread out to undesired areas due to thermal diffusion which is employed for spreading the p-type impurities of the first type. Spreading out of the p-type dopant over a greater vertical dimension compared to the n-type dopant makes the fabrication process more practical, since small deviations in the depths of the p and n regions will still allow for the p-type dopant to compensate the n-type dopant throughout its depth in the region of the vias.

If a technique were used to mask out n-type impurities from undesired portions and form the grid-like structure with n-type impurities alone, such would not be entirely satisfactory, since such a procedure would tend to result in tailing up to the surface of some n-type impurity. This occurs due to a small sloping of the edge of the implant mask which normally occurs in the preparation thereof. Even if the mask edge could be made perfectly vertical, an undesirable amount of tailing of the implant would occur since the n-type implant must be aligned 7 degrees from the wafer normal to avoid the effects of channeling of the implant in the Si substrate. Tailing of the implant to the surface is undesirable as it would change the properties of the device located on the surface.

It is desirable to provide the additional p-type dopants as discussed hereinabove above the n-type dopants in order to electrically isolate the subsequent grid structure from the circuits on the surface. This makes it possible to locate the n-type regions closer to the surface of the substrate, without having spurious current flow between the n-type grid and n-type circuit elements. The intervening layer of enhanced p-type doping concentration helps prevent "punch-through" when a high voltage is applied to the surface n-type circuit elements.

Moreover, such a structure increases the capacitance of the grid enabling it to absorb or take on more charge.

Another advantage of the structure is that the p-type doping in the vias 13. is higher than the doping in the substrate under these implanted regions. This higher doping creates a small potential barrier which opposes the flow of excess minority carriers thru the via from the underlying substrate region.

Some small amount of excess minority carriers may still flow through the vias and be collected in the circuits immediately above them. Therefore, in preferred embodiments of the present invention, the p-type vias in the grid are aligned to the least sensitive portions of the subsequently to be defined circuit, such as where bit lines are made. Also, the p-type vias 13 in the grid are preferably aligned to regions to be subsequently delineated on the surface wherein increased capacitance is not desired. For instance, with respect to bit lines, bit lines are usually connected to a fixed potential during large amounts of time and therefore remove the excess charge caused by ionizing radiation harmlessly. Also, bit lines need to have low capacitance to the substrate, so placing the bit lines over the deeper p-type regions allows the depletion region around the bit line to extend deeper into the lighter doped substrate material, so that the bit line capacitance is not adversely affected.

The steps normally used after the implantation of the n-type impurities will not normally substantially affect the already formed regions. This is particularly so, since the n-type and p-type regions are of a low dose and are already spread out in the structure. Therefore, there is a small gradient of doping whereas spreading out due to thermal exposure usually occurs with heavier doping which is in smaller or more concentrated areas.

Of course, although the above procedure is the most preferred for forming the grid-like structure according to the present invention, other methods can be employed if desired. For instance, the buried grid structure could also be obtained by ion-implanting or diffusing impurities of a second type into a substrate and then growing an epitaxial layer of semiconductive material containing impurities of a first type on top of the substrate containing the impurities of the second type. In such an instance, a preferred n-type impurity would be arsenic.

After this, the desired circuitry or devices can be provided on the substrate in any manner. A simplified procedure to demonstrate the effectiveness of the present invention will be discussed hereinbelow to provide n-type junctions on the substrate surface for monitoring collection of excess minority charge.

A pad silicon dioxide layer 4 is provided by thermal oxidation to a thickness of about 25 nm to protect the silicon surface 2 during subsequent implant and subsequent oxidation steps (see FIG. 1.4). An example of a technique to provide the oxide is by heating at about $900\pm°$ C. in dry $O_2$ for about $\frac{1}{2}$ hour.

Ion implantation or thermal diffusion 5 of a p-type impurity is carried out to provide extra isolation between subsequently to be fabricated junctions. A typical example is the ion-implantation of boron employing a dosage of about $6\times10^{11}/cm^2$ with an energy level of about 14.2 keV through the silicon dioxide layer 4. After this, a field oxide 6 of about 400 nm silicon dioxide can be provided such as by chemical vapor deposition. The oxide can be annealed at about $1000\pm°$ C. for about 5 minutes in a dry oxygen atmosphere for densifying the oxide layers 4 and 6. For simplicity, layers 4 and 6 are shown as layer 6 in FIG. 1.5.

Junctions can be patterned using known photolithographic etching techniques to etch windows in oxide 6, after which n-type impurities, such as arsenic, can be thermally diffused or ion-implanted. A typical arsenic implant can be a dose of about $1\times10^{16}/cm^2$ and an energy of about 50 keV. The n-type arsenic over compensates the boron p-type doping in the predetermined patterned regions 7 and 8 (see FIG. 1.5).

After this, an insulation layer over the diffused portions can be provided by thermal growth to provide about 150 nm thickness of silicon dioxide. Such can be accomplished by a dry/wet/dry treatment at about 1000±° C. The oxide layer 6 and new oxide are shown as 6A in FIG. 1.6.

The electrical connections can be fabricated by known photolithographic techniques to provide contact holes or vias through the oxide insulation layer to allow electrical connection to be made to the n+ regions 7 and 8 (see FIG. 1.7).

Next, the metallic-type high electrical conductivity interconnection line material 9, preferably a metal, is deposited and the interconnection pattern is delineated. An example of a highly conductive material commonly used for interconnections is aluminum. The high electrical conductivity material, such as aluminum, may be deposited by sputtering or, preferably, by evaporation.

The n+ or node region 7 is not aligned to the grid and in the present illustration is of a node where the added capacitance and increased protection are beneficial. The n+ or node region 8 is aligned to a grid via, and illustrates a node which could be deleteriously affected by the additional capacitance of a shallow buried p+ layer.

Reference to FIG. 2 illustrates measurements of collected charge versus alpha-particle energy for a structure containing a floating grid, as discussed hereinabove according to the present invention, and one which differs only in the absence of such grid. In particular, the model employed for the tests leading to the results shown in FIG. 2 includes a grid of n-type silicon having a peak concentration buried about 2.6 micron below the surface in a 5 ohm/cm p-type substrate. The spread of the n-type impurity is about 0.5 micron. The grid employed is an n-type buried layer with regularly spaced 5 micron wide vias through it to allow electrical conduction between the surface p layer and underlying substrate. The grid, as demonstrated by this data, blocks out as much as about 85% of the charge that normally would be collected in a 17 micron by 1700 micron diode hit by a 4.5 MEV alpha particle.

In addition, if desired, the grid can be electrically connected to a positive power supply in order to draw off the charge collected thereby. However, such is not necessary, since the grid, as employed according to the present invention, collects the charge which is generated in a localized area and redistributes the charge over a large area of the grid where it is later reemitted. This reduces the density of the excess charge to such a degree that the amount of charge subsequently collected by any one device on the substrate surface is not sufficient to cause an error in the circuit.

Figure 3:
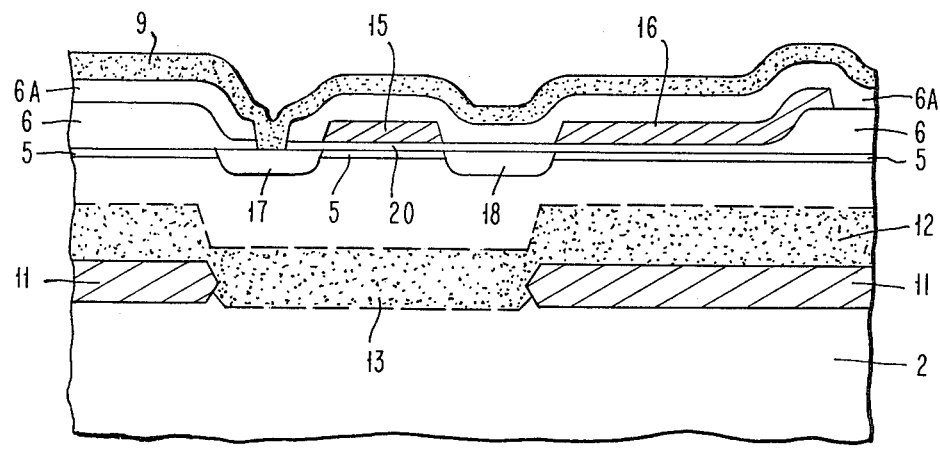
FIG. 3 is a cross-sectional view of a typical device employing the present invention.
Figure 4:
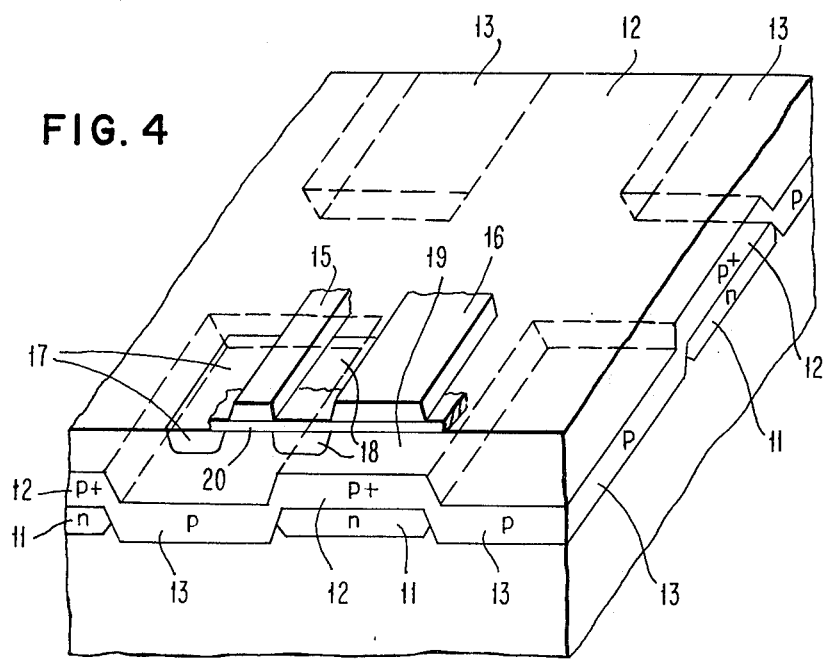
FIG. 4 is a schematic isometric view of a memory cell aligned to the buried grid.

It is understood, of course, that the present invention is applicable to any type of integrated circuit on a semiconductor substrate, a typical example of which is a dynamic one-device memory cell as illustrated in FIG. 3. Such can be fabricated by known techniques once the grid is provided according to the present invention, and such known techniques need not be discussed herein in any great detail. The structure illustrated in FIG. 3 can be fabricated by, for instance, starting with the structure as shown in FIG. 1.4 and following the sequence of etching windows in the oxide layer 6 where memory cells are to be located; growing the gate oxide 20; defining the FET polysilicon device gate 15 and the upper polysilicon electrode 16 of the storage capacitor; implanting or diffusing the n-type source and drain regions 17 and 18; depositing the silicon oxide isolation 6A; and providing the intermetallic connections 9. In addition, the upper electrode of the storage capacitor is connected to a positive power source not shown to create an inversion layer on the silicon surface under that electrode serving as the bottom electrode of the storage capacitor, also not shown. As noted, the p-type vias in the grid are aligned to the FET device gate, source, and drain regions. FIG. 4 is an isometric view of a memory cell aligned to the buried grid.

What is claimed is:

1. In a semiconductor substrate wherein the improvement comprises a buried interconnected grid-like region of enhanced concentration of impurity type opposite to that of the semiconductive substrate for collecting excess minority carriers generated in the semiconductor substrate.

2. The semiconductor substrate of claim 1 wherein vias in the grid-like region are provided by impurities which are the same type as the impurities of the semiconductive substrate and opposite from the impurities of the grid-like structure, and wherein the dosage of the impurities providing the vias of the grid-like structure is higher than that of the grid-like structure.

3. The semiconductor substrate of claim 1 or 2 wherein a region of enhanced concentration of impurity type the same as that of the semiconductor substrate and opposite that of the grid-like region is located above the grid-like region.

4. The semiconductor substrate of claim 1 or 2 wherein said impurity type opposite to that of the semiconductor substrate is an n-type material.

5. The semiconductor substrate of claim 1 or 2 wherein the vias in the grid-like region are aligned to the least sensitive portions of the circuitry on the semiconductor substrate.

6. The semiconductor substrate of claim 1 wherein the grid-like region is about 1 to about 5 microns below the upper surface of the substrate.

7. The semiconductor substrate of claim 1 wherein the peak concentration of the grid-like structure is about 2.5 microns below the surface of the substrate.

8. The semiconductor substrate of claim 1 wherein the grid-like region is about 0.5 microns thick.

9. The semiconductor substrate of claim 1 wherein said grid is not electrically connected to any power supply.

* * * * *